(12) United States Patent
Dip et al.

(10) Patent No.: US 7,910,494 B2
(45) Date of Patent: Mar. 22, 2011

(54) THERMAL PROCESSING FURNACE, GAS DELIVERY SYSTEM THEREFOR, AND METHODS FOR DELIVERING A PROCESS GAS THERETO

(75) Inventors: Anthony Dip, Cedar Creek, TX (US); Eric J. Malstrom, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 318 days.

(21) Appl. No.: 11/277,814

(22) Filed: Mar. 29, 2006

(65) Prior Publication Data

US 2007/0231757 A1    Oct. 4, 2007

(51) Int. Cl.
*H01L 21/31* (2006.01)
*C30B 23/03* (2006.01)

(52) U.S. Cl. ........ 438/770; 438/935; 438/769; 438/777; 431/174

(58) Field of Classification Search .................. 431/174; 438/770, 769, 777
See application file for complete search history.

(56) References Cited

U.S. PATENT DOCUMENTS

| | | | |
|---|---|---|---|
| 5,808,398 A | 9/1998 | Stoffels et al. | |
| 5,939,763 A | 8/1999 | Hao et al. | |
| 6,001,694 A | 12/1999 | Shih et al. | |
| 6,207,304 B1 | 3/2001 | Law et al. | |
| 6,248,628 B1 | 6/2001 | Halliyal et al. | |
| 6,413,884 B1* | 7/2002 | Moriyama | 438/784 |
| 6,436,848 B1 | 8/2002 | Ramkumar | |
| 6,450,116 B1 | 9/2002 | Noble et al. | |
| 6,454,854 B1* | 9/2002 | Ose | 117/90 |
| 6,573,178 B1* | 6/2003 | Nakamura | 438/643 |
| 6,649,537 B1 | 11/2003 | Reder et al. | |
| 6,692,249 B1 | 2/2004 | Beatty et al. | |
| 6,709,928 B1* | 3/2004 | Jenne et al. | 438/264 |
| 6,750,110 B1* | 6/2004 | Derderian | 438/381 |

(Continued)

FOREIGN PATENT DOCUMENTS

EP    1043764 A1    10/2000

(Continued)

OTHER PUBLICATIONS

Ellis, K.A. et al., Nitrous Oxide (N2O) Processing for Silicon Oxynitride Gate Dieletrics, IBM J. Res. Develop. vol. 43, No. 3, May 1999, pp. 287-300.

(Continued)

*Primary Examiner* — Carl D Price
*Assistant Examiner* — Nikhil Mashruwala
(74) *Attorney, Agent, or Firm* — Wood, Herron & Evans, LLP

(57) ABSTRACT

A gas delivery system for supplying a process gas from a gas supply to a thermal processing furnace, a thermal processing furnace equipped with the gas delivery system, and methods for delivering process gas to a thermal processing furnace. The gas delivery system comprises a plurality of regulators, such as mass flow controllers, in a process gas manifold coupling a gas supply with a thermal processing furnace. The regulators establish a corresponding plurality of flows of a process gas at a plurality of flow rates communicated by the process gas manifold to the thermal processing furnace. The gas delivery system may be a component of the thermal processing furnace that further includes a liner that surrounds a processing space inside the thermal processing furnace.

14 Claims, 3 Drawing Sheets

U.S. PATENT DOCUMENTS

| | | | |
|---|---|---|---|
| 6,818,558 B1 * | 11/2004 | Rathor et al. | 438/694 |
| 6,869,892 B1 | 3/2005 | Suzuki et al. | |
| 6,929,699 B2 | 8/2005 | Whitesell | |
| 6,939,756 B1 | 9/2005 | Chung et al. | |
| 7,534,730 B2 * | 5/2009 | Ozaki et al. | 438/770 |
| 2002/0182888 A1 | 12/2002 | Buchanan et al. | |

FOREIGN PATENT DOCUMENTS

| | | | |
|---|---|---|---|
| JP | 63025914 | * | 2/1988 |
| JP | EP 1043764 A1 | * | 11/2000 |

OTHER PUBLICATIONS

Dang, Sanjit Singh et al., Nitrous Oxide-Based Progressive Silicon Oxynitridation in Furnaces of Different Dimensions, Advanced Materials Research Laboratory, Department of Chemical Engineering, University of Illinois at Chicago, Chicago, IL 60607, Undated, 5 pages.

European Patent Office, International Search Report issued in corresponding PCT Application serial No. PCT/US2007/064461 dated Aug. 14, 2007.

* cited by examiner

THERMAL PROCESSING FURNACE, GAS DELIVERY SYSTEM THEREFOR, AND METHODS FOR DELIVERING A PROCESS GAS THERETO

FIELD OF THE INVENTION

This invention relates to the field of semiconductor processing, and, more particularly, to gas delivery systems for a thermal processing furnace, thermal processing furnaces with a gas delivery system, and methods for delivering a process gas to a thermal processing furnace.

BACKGROUND OF THE INVENTION

Thermal processing furnaces are commonly used to perform a variety of semiconductor fabrication processes, including but not limited to oxidation, diffusion, annealing, and chemical vapor deposition (CVD). Most conventional thermal processing furnaces typically employ a processing chamber that is oriented either horizontally or vertically. Vertical thermal processing furnaces generate fewer particles during processing, which reduces substrate contamination, are readily automated, and require less floor space because of their relatively small footprint.

One common application of thermal processing furnaces is the growth of high-quality thin dielectric layers during integrated circuit manufacture to provide, among other uses, device isolation, transistor gate dielectrics and capacitor dielectrics. Dielectric layers of silicon dioxide grown by conventional wet or dry thermal oxidation processes exhibit reduced quality and long-term reliability as the thickness is reduced. Oxidation of silicon in an ambient containing nitrous oxide ($N_2O$) is recognized as a means for improving the quality of silicon dioxide dielectric layers, as compared to those grown via conventional dry or wet oxidation processes. The increased reliability of such dielectric layers may result from the incorporation of nitrogen atoms originating from the nitrous oxide into the silicon dioxide matrix to form a silicon oxynitride. After a thin layer of silicon oxynitride forms on the surface, the diffusion of oxidant species to the underlying silicon is greatly hampered. Thus, the resultant dielectric layers grown using a process gas containing nitrous oxide are thin. Other benefits accrue from the use of silicon oxynitride as a dielectric, such as superior diffusion barrier properties for certain common dopant species like boron used in semiconductor device fabrication.

When using nitrous oxide as a process gas for forming silicon oxynitride dielectrics, a problem that is encountered is process matching or the repeatability of a process among different tools when exactly the same process and hardware configuration is used. The outcome is different process results (e.g., thickness for the oxynitride layer and the nitrogen profile in the oxynitride layer) among different thermal processing furnaces. To increase throughput, a typical process line includes multiple thermal processing furnaces. Achieving process uniformity among the different thermal processing furnaces is desired but, unfortunately, rarely achieved.

One attribute of conventional hardware configurations is that the flow of nitrous oxide to the process chamber is regulated or metered by a mass flow controller. The delivery line transporting the metered nitrous oxide flow is divided at a common point in the gas manifold downstream from the mass flow controller. The divided metered nitrous oxide flow is conveyed to a pair of gas injectors, which inject the nitrous oxide process gas inside the process chamber for forming silicon oxynitride layers on the substrates held inside the process chamber. Upon injection, the nitrous oxide spontaneously undergoes an exothermic reaction that decomposes or cracks the nitrous oxide molecules to form nitric oxide (NO) and other reaction by-products (e.g., $O_2$, $N_2$), which react with the substrates to grow the oxynitride layer.

The gas injectors for thermal processing furnaces are hand manufactured from a length of dielectric tubing to specific dimensional tolerances that are predetermined according to the hardware configuration of the thermal processing furnace. Minor deviations from targeted manufacturing tolerances often result in a set of gas injectors that exhibits an asymmetrical or non-symmetric flow ratio among the individual gas injectors. Attempts to manufacture different sets of gas injectors to identical dimensional tolerances so as to exhibit identical non-symmetric flow ratios as a master set of gas injectors is difficult, if not impossible.

The flow ratio of the nitrous oxide injected into the process chamber is an important parameter in determining the reaction by-products of the cracking or decomposition. A variation in the flow rate ratio may cause a significant change in the nitrogen content and profile in the oxynitride layer and/or a significant change in the layer thickness. Because of the inability to manufacture dimensionally matched sets of gas injectors, significant differences in the properties of the oxynitride layer may be apparent for the same intended process executing on different conventional thermal processing furnaces, which is unacceptable.

There is thus a need for an improved apparatus and method for controlling the cracking of nitrous oxide in a thermal processing furnace that overcomes these and other disadvantages of the apparatus and methods currently used in conventional thermal processing furnaces.

SUMMARY OF THE INVENTION

One embodiment of the present invention provides a gas delivery system for supplying a process gas from a gas supply to a thermal processing furnace. The gas delivery system comprises a process gas manifold adapted to couple the gas supply with the thermal processing furnace and first and second regulators, which may advantageously be mass flow controllers, each coupled with the process gas manifold between the gas supply and the thermal processing furnace. The first regulator establishes a first flow rate of a first flow of the process gas communicated by the process gas manifold to the thermal processing furnace. The second regulator establishes a second flow rate of a second flow of the process gas communicated by the process gas manifold to the thermal processing furnace. In certain embodiments of the present invention, the gas delivery system may be a component of the thermal processing furnace that further includes a liner surrounding a processing space inside the thermal processing furnace in which the substrates are processed with the process gas.

In another embodiment, the thermal processing furnace may comprise a furnace tube having a substrate processing space and first and second gas injectors positioned inside the furnace tube. The first gas injector includes a first outlet positioned for injecting a first flow of the process gas into the processing space. Similarly, the second gas injector includes a second outlet positioned for injecting a second flow of the process gas into the processing space. The thermal processing furnace further comprises a first regulator coupled in fluid communication with the first gas injector and a second regulator coupled in fluid communication with the second gas injector. The first regulator is configured to control a first flow rate of the process gas to the first gas injector. The second regulator is configured to control a second flow rate of the process gas to the second gas injector.

In another embodiment, a method is provided for processing substrates with a process gas in a processing space inside, for example, a thermal processing furnace. The method comprises branching a flow of the process gas to establish a first stream and a second stream, metering the first stream of the process gas to establish a first mass flow rate, and metering the second stream of the process gas to establish a second mass flow rate. The method further comprises injecting the first and second streams of the process gas into the processing space at the respective first and second mass flow rates and combining the first and second streams of the process gas inside the processing space.

In yet another embodiment, a method is provided for controlling a process for growing an oxynitride layer with a nitrogen content on a substrate. The method comprises injecting first and second gas streams each containing nitrous oxide at a flow rate ratio into a processing space, exposing the substrate held in the processing space to the plurality of gas streams, and heating the substrate to a process temperature adequate to grow the oxynitride layer on the substrate. The method further comprises changing the flow rate ratio between the first and second gas streams to alter the nitrogen content in the oxynitride layer without changing the process temperature.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1:
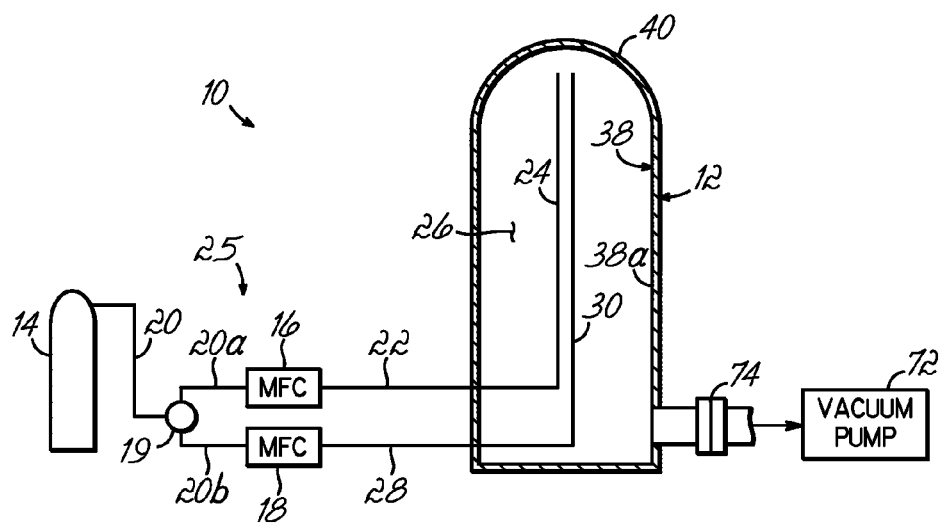
FIG. 1 is a diagrammatic view of a thermal processing furnace of the present invention.
Figure 5:
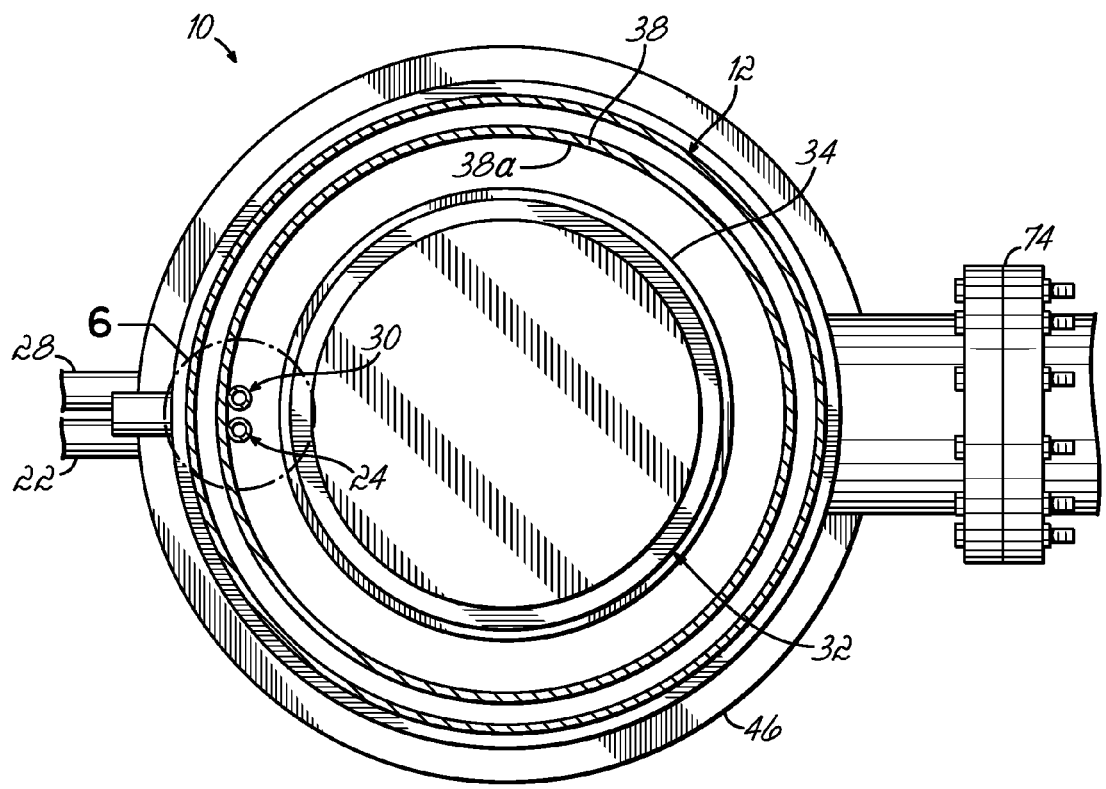
FIG. 5 is a top view in partial cross section of the thermal processing furnace of FIG. 2 taken generally along line 5-5 from FIG. 2.
Figure 2:
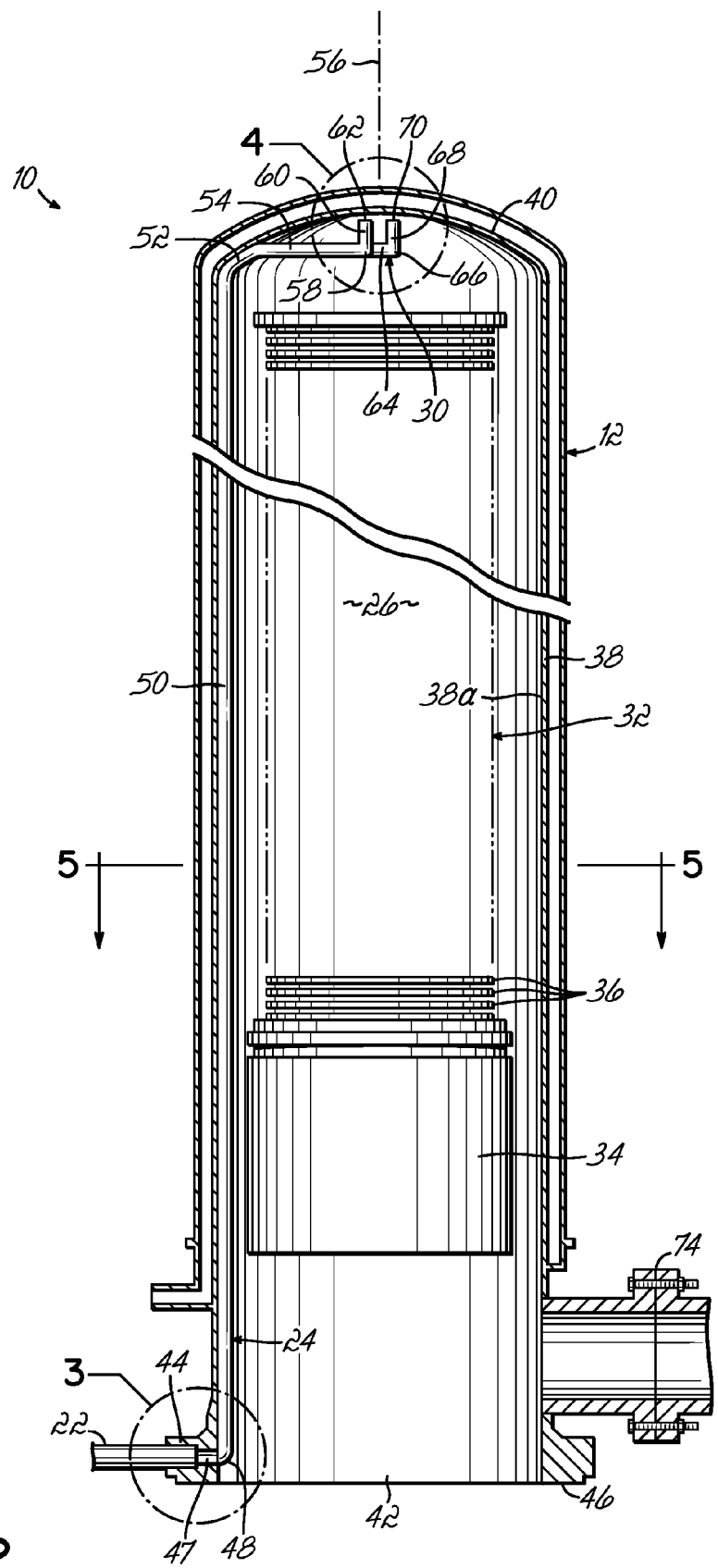
FIG. 2 is a side view in partial cross section of a thermal processing furnace of the present invention.

With reference to FIG. 1, a process tool in the form of a thermal processing furnace 10 comprises a furnace tube or outer housing 12 that surrounds a processing compartment or space 26 adapted to receive a batch of substrates 36 (FIG. 2). The thermal processing furnace 10 utilizes the process gas supplied from a gas supply 14, such as a gas cylinder of compressed process gas, for growing a layer on a batch of substrates 36 in the controlled atmosphere ambient of the processing space 26 that contains a partial pressure of a process gas. More specifically, the thermal processing furnace 10 may be used for thermal oxidation of silicon substrates 36 in a controlled atmosphere ambient containing a process gas such as, for example, nitrous oxide ($N_2O$) to incorporate nitrogen atoms originating from the nitrous oxide into a silicon dioxide matrix to form a silicon oxynitride layer on a batch of semiconductor substrates 36. The invention contemplates that the process tool constituting the point of use for the process gas may comprise a different type of processing apparatus. In any event, the process gas supplied from the gas supply 14 is typically electronics grade in purity.

The gas supply 14 is coupled in fluid communication with a pair of regulators, represented by mass flow controllers 16, 18, by a delivery line 20 of a gas manifold 25. At a branch site 19 upstream from the mass flow controllers 16, 18, the delivery line 20 is bifurcated into two separate branch delivery lines 20a,b. A portion of the process gas flowing in delivery line 20 is diverted into each of the branch delivery lines 20a,b at the branch site 19. As a result, each of the mass flow controllers 16, 18 receives an independent stream of process gas from the gas supply 14. Of course, the delivery line 20 may be split among more than two branch delivery lines, similar to branch delivery lines 20a,b, if additional mass flow controllers (not shown) are added to the gas manifold 25. The gas manifold 25 advantageously solves many of the deficiencies of conventional gas manifolds for thermal processing systems constructed similar or identical to thermal processing system 10.

A delivery line 22 of the gas manifold 25 communicates a flow of process gas from mass flow controller 16 to a gas injector 24 in the form of a conduit stationed inside the thermal processing furnace 10 that injects the flow into the processing space 26 defined inside the outer housing 12. Another delivery line 28 of the gas manifold 25 communicates a flow of process gas from mass flow controller 18 to another gas injector 30 in the form of a conduit stationed inside the thermal furnace 10 that likewise injects the flow inside the processing space 26. The two delivery lines 22, 28 define independent flow paths from the gas supply 14 to the thermal processing furnace 10.

The mass flow controllers 16, 18 are closed loop devices that set, measure, and control the flow of the process gas to the gas injectors 24, 30, respectively. To that end, the mass flow controllers 16, 18 include a mass flow sensor and a valve that meters and controls the rate of flow of gas in response to control signals generated by circuitry interfaced with, and receiving mass flow measurements from, the mass flow sensor. Although the invention is not so limited, the mass flow controllers 16, 18 may comprise 30 standard cubic centimeters per minute (sccm) mass flow controllers.

The mass flow controllers 16, 18 regulate and control the flow rate of process gas in each of the delivery lines 22, 28 such that the flow rates in the delivery lines 22, 28 from the gas supply 14 to the gas injectors 24, 30 are independently controlled. The result is that the relative flow rates of the process gas injected from the two gas injectors 24, 30 at the corresponding injection points inside the thermal processing furnace 10 are independently controlled by the mass flow controllers 16, 18. Advantageously, the independent control over the flow rates of process gas injected by the gas injectors 24, 30 represents a significant improvement over conventional gas manifolds that split or divide a single mass-flow controlled process gas stream to conventional injectors inside a thermal furnace.

The delivery lines 20, 22, 28 and the gas injectors 24, 30 are open ended conduits or tubing having a sidewall with inner and outer diameters that surrounds a lumen through which the process gas flows. Conventional couplings are used to establish fluid connections. The control over the individual flow rates is achieved without regard to the configuration (length, geometry, etc.) of the individual delivery lines 20, 22, 28 and gas injectors 24, 30. The delivery lines 20, 22, 28 are commonly manufactured from stainless steel and the gas injectors 24, 30 are commonly formed from a ceramic like quartz.

With reference to FIGS. 2-6, a wafer boat 32 is disposed inside the thermal processing furnace 10 and is supported on a pedestal 34. The wafer boat 32, which is typically composed of quartz, includes a plurality of open slots that accommodate a corresponding plurality of substrates 36. The open slots in the wafer boat 32 are spaced apart such that unreacted process gas is readily available to react with the substrates 36. Unprocessed substrates 36 are inserted into the slots of wafer boat 32 and processed substrates 36 are removed from the slots by a robotic wafer handler (not shown). The pedestal 34 is coupled to a boat elevator (not shown) for inserting and removing the wafer boat 32.

The process chamber 12 includes a process tube or liner 38 that has a domed ceiling 40 and an opposed open end 42 that is sealed with a base plate (not shown). The wafer boat 32 and substrates 36 are disposed inside the liner 38 generally between the domed ceiling 40 and open end 42 of the liner 38, which peripherally bounds the processing space 26. The dimensions of the liner 38, and thus the size of the thermal processing furnace 10, may be scaled to accommodate substrates 36 of different sizes. The liner 38 may be composed of any high temperature material, such as quartz, silicon carbide, and another suitable ceramic material, and is removable for cleaning to remove accumulated deposits that are an artifact of substrate processing.

A suitable heating element (not shown) is positioned outside of the outer housing 12 and operates to elevate the temperature of the liner 38 by heat transfer so that the processing space 26 is surrounded by a hot wall during substrate processing. For example, the heating element may comprise a cylindrical shaped heating element that surrounds the exterior of the outer housing 12. The heating element may be divided into a plurality of heating zones each having an independent power source for controlling the corresponding zone temperature. Temperature sensors (not shown), such as thermocouples, are stationed along the height of the liner 38 and provide temperature information for the different heating zones. The temperature sensors supply feedback used by a temperature controller (not shown) to regulate the monitored temperature of the liner 38 in each of the heating zones. Typically, the zone temperatures are regulated to provide a flat or isothermal temperature profile for the liner 38 at a target temperature specified for the process, which is typically in the range of 800° C. to 1200° C. and, more typically, in the range of 900° C. to 1000° C. The temperature controller may employ, for example, a proportional integral derivative (PID) algorithm to determine the power applied to each zone of the heating element based upon the error between the monitor and target temperatures.

Delivery line 22 from the mass flow controller 16 is routed to a fluid feedthrough 44 mounted to a port in the liner 38 near a base 46 of the thermal processing furnace 10. The delivery line 22, which is commonly made of a stainless steel, is transitioned in the feedthrough 44 to communicate with gas injector 24, which is commonly formed from a ceramic like quartz. Delivery line 28 is likewise transitioned through a feedthrough (not shown) to communicate with gas injector 30. In this manner, the process gas is transferred to the interior of the liner 38.

Figure 3:
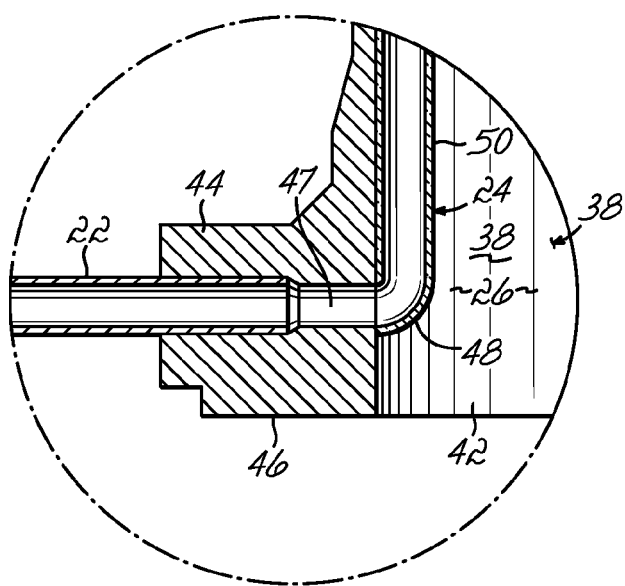
FIG. 3 is a detailed view of a first portion of FIG. 2.
Figure 6:
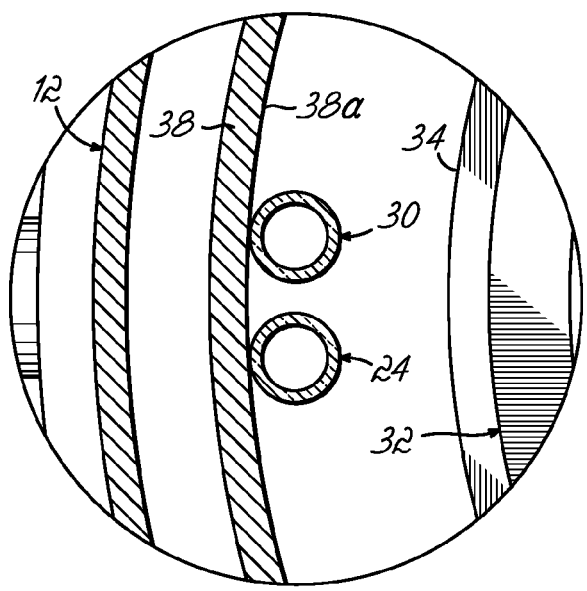
FIG. 6 is a detailed view of a portion of FIG. 5.

Gas injector 24 has a stem portion 47 that enters the liner 38 horizontally, as best shown in FIG. 3, via fluid feedthrough 44 and bends in a near right angle 48 to define a vertical portion 50 positioned between the liner 38 and wafer boat 32. The vertical portion 50 provides a vertical rise that extends proximate to a curved, inwardly-facing surface 38a of the liner 38, as best shown in FIG. 6. The proximity of the vertical portion 50 to the liner 38 rapidly heats the process gas flowing through the gas injector 24 above the temperature, typically room temperature, at entry into the thermal processing furnace 10.

Figure 4:
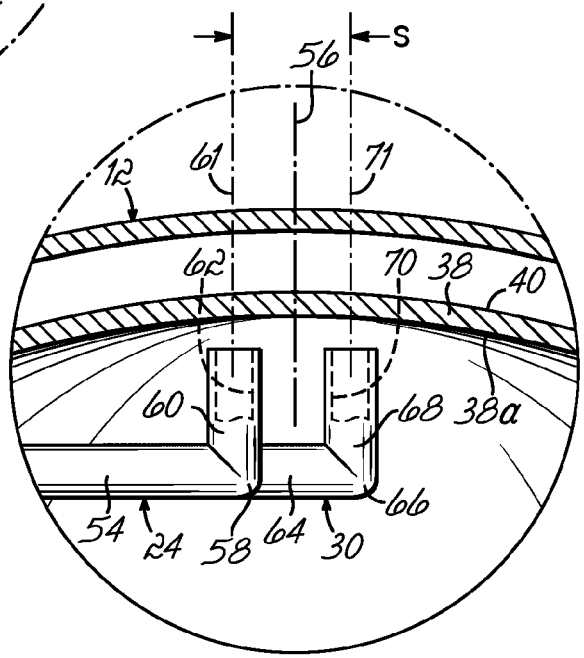
FIG. 4 is a detailed view of a second portion of FIG. 2.

Near the domed ceiling 40 of liner 38, an angled bend 52 redirects the gas injector 24 to define a radial segment 54 that extends in a horizontal run generally toward an azimuthal axis 56 of the liner 38. At a location near the azimuthal axis 56 and as best shown in FIG. 4, the gas injector 24 bends in at an angled bend 58 to define a short vertical portion 60 extending toward the domed ceiling 40. An injection port or outlet 62 is defined at the free end or tip of the gas injector 24 and the vertical portion 60 is oriented such that the process gas exiting the outlet 62 is directed generally toward domed ceiling 40. The outlet 62 is spaced from the domed ceiling 40.

Gas injector 30 has a construction similar to gas injector 24 that includes a vertical portion (not shown) similar to the vertical portion 50 of gas injector 24. The gas injector 30 includes a radial segment 64 and an angled bend 66 connecting the radial segment to a vertical portion 68. The vertical portion 68 extends toward the domed ceiling 40 of liner 38 and terminates at an injection port or outlet 70 defined at the tip of the gas injector 30. The outlet 70 of gas injector 30 is positioned adjacent to the outlet of gas injector 24 near the domed ceiling 40 of liner 38. In exemplary embodiments, the gas injectors 24, 30 have an inner diameter of 5 mm to 6 mm defining the fluid lumen and an outer diameter of about 8 mm so that the wall thickness is between 2 mm and 3 mm, equal diameter outlets 62, 70 that are equidistant from the nearest portion of the domed ceiling 40, and the center-to-center distance, S, between centerlines 61, 71 of the outlets 62, 70 is less than about 20 mm and, advantageously, about 10 mm to about 20 mm.

The outlets 62, 70 may be located at approximately the same distance from the inner surface of the domed ceiling 40 or may be positioned with different relative separations from the inner surface of the domed ceiling 40. For gas injector 24, as an example, the positioning of the outlet 62 may be varied by changing the length of the vertical portion 60 and/or by changing the angles of the bends 52, 58. For gas injector 24, as an example, the length of radial segment 54 will determine the separation of the outlet 62 from the azimuthal axis 56.

The invention contemplates that additional gas injectors (not shown), each similar or identical to gas injectors 24, 30, may be located inside the thermal processing furnace 10. These additional gas injectors may be fed process gas originating from gas supply 14 and, thus, have a flow rate regulated by a corresponding mass flow controller (not shown) similar to mass flow controllers 16, 18. In this manner, the thermal processing furnace 10 may be equipped with a plurality of more than two gas injectors and process gas injection points.

Volatile reaction products and unreacted process gas are evacuated from the processing space 26 by a vacuum pump 72 (FIG. 1) through a vacuum port 74 near the base 46. During operation, the evacuation of the processing space 26 is continuous, as is the introduction of process gas via gas injectors 24, 30.

In use and with reference to FIGS. 1-6, the process run is initiated with the liner 38 held at an idle temperature. The substrates 36 are loaded into the wafer boat 32 and the temperature of the liner 38 is ramped up to the target process temperature. Process gas is directed through the mass flow controllers 16, 18 with individually controlled flow rates to the gas injectors 24, 30. Heat transferred from the liner 38 heats the process gas over the vertical rise of the gas injectors 24, 30 toward the domed ceiling 40 of liner 38. The heated process gas is injected into the processing space 26 from the outlets 62, 70 of the gas injectors 24, 30, respectively. The heated process gas, which may experience a reaction upon injection, flows downwardly toward the vacuum port 74 under the influence of the vacuum pump 72. The process gas and/or its reaction products may chemically react with the heated substrates 36 to form a surface layer on each substrate 36. Unreacted process gas and volatile reaction products are evacuated from the processing space 26 through the vacuum port 74. After a given amount of time at the process temperature sufficient to accomplish the desired process, the process gas flow is discontinued, the liner 38 is cooled back to an idle temperature, and the processed substrates 36 are unloaded from the thermal processing furnace 10.

The present invention may be particularly advantageous if the injected process gas is nitrous oxide. Specifically, nitrous oxide injected from the outlets 62, 70 of the gas injectors 24, 30 experiences an exothermic reaction that decomposes or cracks the nitrous oxide molecules to form nitric oxide (NO) and other reaction by-products (e.g., $O_2$, $N_2$). The nitrous oxide decomposition is believed to predominantly occur before the flow reaches the substrates 36 held by the boat 32. A primary factor that influences the relative amounts of reaction by-products formed by nitrous oxide cracking is the peak gas temperature near the point of injection. The spontaneous exothermic reaction experienced by the nitrous oxide increases the gas temperature. Without wishing to be limited by theory, the magnitude of temperature increase is believed to depend, among other things, on the process temperature and the nitrous oxide flow rate. Silicon substrates 36 exposed to the decomposed nitrous oxide will grow a surface layer of oxynitride that may be represented by the chemical formula $Si_xO_yN_z$. The chemical structure and composition, including the uniformity of the distribution of nitrogen throughout the oxynitride thin film, may vary depending on the process conditions.

In accordance with the invention, the peak gas temperature of the arriving nitrous oxide may be advantageously controlled or modulated by independently selecting the flow rates of nitrous oxide to each of the gas injectors 24, 30 using the mass flow controllers 16, 18. The selection of the individual flow rates assigns a precise ratio to the gas velocity for the injected flows of nitrous oxide, which determines the nature of the nitrous oxide flow field near the outlets 62, 70 of the gas injectors 24, 30 and at the domed ceiling 40 of the liner 38. The flow field from the interaction of the individual flows influences the temperature distribution of the arriving nitrous oxide, which controls the amounts of nitric oxide and other reaction by-products (e.g., $O_2$, $N_2$) resulting from the nitric oxide decomposition and ultimately influences the characteristics of the oxynitride thin films formed on the substrates 36.

The present invention advantageously allows for a universal hardware configuration with two mass flow controllers 16, 18 in which the nitric oxide production from the nitrous oxide may be varied while holding the substrates 36 at a single, fixed process temperature. A specific process may be repeatable among different thermal processing furnaces 10 having the universal hardware configuration by regulating the decomposition of the nitric oxide using the independently adjustable gas flows. This permits better tool matching among different thermal processing furnaces 10 of the invention. The ability to modulate the reaction by-products from the nitric oxide cracking and, in particular, the amount of nitric oxide permits the nitrogen content in the oxynitride thin film to be varied at any process temperature by merely changing the flow rate ratio among the gas injectors 24, 30. In contrast, the sole recognized technique for varying the nitrogen content in oxynitride thin films in conventional thermal processing furnaces is believed to be changing the process temperature, which unwantedly prompts a change in the oxidation process. The present invention permits the nitrogen content in the oxynitride thin films to be varied independent of the process temperature or without changing the oxidation process. In other words, changing the flow rate ratio between the first and second gas streams may be used to alter the nitrogen content in the oxynitride layer without changing the process temperature or, stated differently, while keeping the process temperature constant.

The present invention is believed to permit the use of nitrous oxide chemistries at lower pressures and temperatures where incomplete cracking of nitrous oxide would ordinarily not occur. Thus, nitrogen profiles in silicon dioxide thin films may be produced that are outside the conventional window of operation for a hardware configuration that lacks the ability to independently control the flow rate ratio among the individual gas injectors.

The present invention offers a cost effective and simplified approach for obtaining repeatable results in the production of oxynitride layers among different thermal processing furnaces, each similar to thermal processing furnace 10. By independently metering the process gas stream to the individual gas injectors, the present invention is tolerant to dimensional variations in the individual gas injectors. The present invention also permits dynamic adjustments to the nitrous oxide cracking to overcome any manufacturing variations in the delivery lines 22, 28 and gas injectors 24, 30 of different thermal processing furnaces. The present invention facilitates tool matching such that a process running on one thermal processing furnace 10 may be more easily implemented on additional thermal processing furnaces 10 with the result that the process is substantially identical among the different thermal processing furnaces 10.

The present invention also advantageously lowers the manufacturing cost of the gas injectors 24, 30 because the manufacturing tolerances are relaxed by the ability to individually regulate the flow rates. The characteristics of conventional gas injectors must be matched at the expense of tight and stringent manufacturing tolerances to provide satisfactory process uniformity among different thermal processing furnaces. In accordance with the present invention, the individual flow rates in the gas injectors 24, 30 may be independently controlled to compensate for hardware differences among the gas injectors 24, 30 and, thereby, advantageously adjusting the nitrous oxide cracking if the thermal processing furnace 10 is using nitrous oxide as a process gas.

In other embodiments, the present invention may be executed in other horizontal or vertical thermal processing furnaces or in rapid thermal processing (RTP) systems having gas injectors.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method for processing a plurality of substrates with nitrous oxide in a processing space, the method comprising:
   heating the substrates to a process temperature;
   metering a first stream of the nitrous oxide flowing in a first delivery line to establish a first flow rate in the first delivery line;

metering a second stream of the nitrous oxide flowing in a second delivery line to establish a second flow rate in the second delivery line;

selecting the first and second flow rates for the nitrous oxide to establish a peak gas temperature of a process gas containing the nitrous oxide in the processing space upon injection and thereby control formation of reaction by-products from the nitrous oxide;

communicating the first and second streams of the nitrous oxide from the first and second delivery lines to respective first and second injectors inside the processing space;

injecting the first and second streams of the nitrous oxide from the first and second injectors into the processing space at the respective first and second flow rates to establish a flow field for an exothermic reaction that provides the peak gas temperature independent of the process temperature of the substrates; and growing a dielectric layer with a nitrogen content on each of the substrates using the process gas.

2. The method of claim 1 further comprising:
heating the first and second streams of the process gas before combining the first and second streams inside the processing space.

3. The method of claim 1 wherein metering the first stream further comprises:
adjusting a first mass flow controller to establish the first flow rate for the first stream.

4. The method of claim 3 wherein metering the second stream further comprises:
adjusting a second mass flow controller to establish the second flow rate for the second stream.

5. The method of claim 1 wherein the first injector has a first outlet inside the processing space, the second injector has a second outlet inside the processing space, and the first and second outlets have a center-to-center separation of less than 20 millimeters.

6. A method of controlling a process for growing an oxynitride layer, the method comprising:
heating a first plurality of substrates to a process temperature;

selecting a first flow rate ratio for first and second streams of nitrous oxide to establish a first nitrogen content in the oxynitride layer on each of the first plurality of substrates upon injection into a processing space;

injecting the first and second gas streams each containing nitrous oxide at the first flow rate ratio into the processing space to grow the oxynitride layer on each of the first plurality of substrates with the first nitrogen content;

heating a second plurality of substrates to the process temperature;

selecting a second flow rate ratio for the first and second streams of the nitrous oxide to establish a second nitrogen content in the oxynitride layer on each of the second plurality of substrates upon injection into the processing space; and injecting the first and second gas streams each containing nitrous oxide at the second flow rate ratio into the processing space to grow the oxynitride layer on each of the plurality of substrates with the second nitrogen content.

7. The method of claim 6 wherein selecting the first flow rate ratio of the first and second gas streams comprises:
metering the first gas stream of the nitrous oxide to establish a first flow rate before injection into the processing space; and
metering the second gas stream of the nitrous oxide to establish a second flow rate before injection into the processing space to provide the first flow rate ratio relative to the first flow rate.

8. The method of claim 6 wherein selecting the first flow rate ratio of the first and second gas streams comprises:
adjusting a first mass flow controller to change the first flow rate.

9. The method of claim 8 wherein selecting the first flow rate ratio of the first and second gas streams comprises:
adjusting a second mass flow controller to change the second flow rate.

10. The method of claim 6 wherein selecting the second flow rate ratio of the first and second gas streams comprises:
metering the first gas stream of the nitrous oxide to establish a first flow rate before injection into the processing space; and
metering the second gas stream of the nitrous oxide to establish a second flow rate before injection into the processing space to provide the second flow rate ratio relative to the first flow rate.

11. The method of claim 6 wherein selecting the second flow rate ratio of the first and second gas streams comprises:
adjusting a first mass flow controller to change the first flow rate.

12. The method of claim 8 wherein selecting the second flow rate ratio of the first and second gas streams comprises:
adjusting a second mass flow controller to change the second flow rate.

13. The method of claim 1 wherein the processing space is inside a process liner having a domed ceiling, and injecting the first and second streams of the nitrous oxide from the first and second injectors into the processing space at the respective first and second mass flow rates further comprises:
injecting the first and seconds streams of the nitrous oxide from the first and second injector toward the domed ceiling.

14. The method of claim 13 wherein the process line has a base, the substrates are loaded in a wafer boat located between the domed ceiling and the base, and further comprising:
evacuating the processing space through a vacuum port near the base.

* * * * *